United States Patent
Chey et al.

(10) Patent No.: US 7,497,366 B2
(45) Date of Patent: *Mar. 3, 2009

(54) GLOBAL VACUUM INJECTION MOLDED SOLDER SYSTEM AND METHOD

(75) Inventors: S. Jay Chey, Ossining, NY (US); Steven A. Cordes, Yorktown Heights, NY (US); Peter A. Gruber, Mohegan Lake, NY (US); John U. Knickerbocker, Monroe, NY (US); James L. Speidell, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/758,752

(22) Filed: Jun. 6, 2007

(65) Prior Publication Data

US 2007/0246853 A1 Oct. 25, 2007

Related U.S. Application Data (63) Continuation-in-part of application No. 11/409,232, filed on Apr. 21, 2006, now Pat. No. 7,416,104.

(51) Int. Cl.
*B23K 31/02* (2006.01)
(52) U.S. Cl. .................................... 228/256; 228/200
(58) Field of Classification Search .................. None
See application file for complete search history.

(56) References Cited

U.S. PATENT DOCUMENTS

| | | | |
|---|---|---|---|
| 5,244,143 A | 9/1993 | Ference et al. | |
| 5,254,362 A | 10/1993 | Shaffer et al. | |
| 5,545,465 A | 8/1996 | Gaynes et al. | |
| 5,593,080 A | 1/1997 | Teshima et al. | |
| 5,718,367 A | 2/1998 | Covell, II et al. | |
| 6,332,569 B1 | 12/2001 | Cordes et al. | |
| 6,390,439 B1 | 5/2002 | Cordes et al. | |
| 6,641,868 B2 | 11/2003 | Abe et al. | |

(Continued)

FOREIGN PATENT DOCUMENTS

CN 1396641 A 2/2003

OTHER PUBLICATIONS

Advanced Packaging Magazine, Nov. 2005.

(Continued)

*Primary Examiner*—Kiley Stoner
(74) *Attorney, Agent, or Firm*—Casey August; Jose Gutman; Fleit Gibbons Gutman Bongini & Bianco P.L.

(57) ABSTRACT

A system and method are provided for injection molding conductive bonding material into a plurality of cavities in a mold within a vacuum chamber. A mold and a fill head are located within a vacuum chamber, wherein the mold includes a plurality of cavities. A vacuum is created within the vacuum chamber, thereby removing air from the chamber and from the cavities. Optionally, rotational motion is provided to at least one of the mold and the fill head while the fill head is in substantial contact with the mold. Conductive bonding material is forced out of the fill head toward the mold, and into at least one of the cavities, while a vacuum is maintained in the vacuum chamber.

1 Claim, 10 Drawing Sheets

U.S. PATENT DOCUMENTS

| | | |
|---|---|---|
| 6,725,769 B1 | 4/2004 | Williams |
| 7,032,513 B2 | 4/2006 | Onishi et al. |
| 7,322,511 B2 * | 1/2008 | Farrar et al. ............ 228/180.21 |
| 2001/0035450 A1 * | 11/2001 | Mannhart et al. ........... 228/105 |
| 2003/0170935 A1 | 9/2003 | Rutiser |
| 2004/0108368 A1 * | 6/2004 | Onishi et al. ............. 228/248.1 |
| 2004/0238595 A1 * | 12/2004 | Nogiwa et al. ............. 228/49.5 |
| 2005/0051604 A1 | 3/2005 | Claver et al. |

OTHER PUBLICATIONS

Gruber, et al., "Low-cost wafer bumping," IBM J. Research and Development, vol. 49, No. 4.5, Jul./Sep. 2005, pp. 621-639.

Technology Roadshow 2005 for Advanced Packaging, MEMS and Nanotechnologies.

* cited by examiner

GLOBAL VACUUM INJECTION MOLDED SOLDER SYSTEM AND METHOD

CROSS REFERENCE TO RELATED APPLICATION

This is a continuation-in-part of application Ser. No. 11/409,232, filed Apr. 21, 2006 now U.S. Pat. No. 7,416,104. The entire disclosure of prior application Ser. No. 11/409,232 is hereby incorporated by reference.

The present patent application is also related to co-pending and commonly owned U.S. patent application Ser. No. 11/409,242, entitled "UNIVERSAL MOLD FOR INJECTION MOLDING OF SOLDER"; U.S. patent application Ser. No. 11/409,233, entitled "FILL HEAD FOR INJECTION MOLDING OF SOLDER"; and U.S. patent application Ser. No. 11/409,244, entitled "CONDUCTIVE BONDING MATERIAL FILL TECHNIQUES", all filed on Apr. 21, 2006, the entire collective teachings of which being hereby incorporated by reference.

FIELD OF THE INVENTION

The present invention generally relates to the field of placement of conductive bonding material such as solder on electronic pads, and more particularly relates to fill techniques and environment for injection molding of solder on integrated circuit chip pads.

BACKGROUND OF THE INVENTION

In modern semiconductor devices, the ever increasing device density and decreasing device dimensions demand more stringent requirements in the packaging or interconnecting techniques of such devices. Conventionally, a flip-chip attachment method has been used in the packaging of IC chips. In the flip-chip attachment method, instead of attaching an IC die to a lead frame in a package, an array of solder balls is formed on the surface of the die.

Injection molded solder ("IMS") is a technique that dispenses molten solder instead of solder paste. However, problems have been observed when the technique is implemented to non-rectangular mold shaped substrates. U.S. Pat. No. 5,244,143, which is commonly owned by International Business Machines Corporation, discloses the injection molded solder technique and is hereby incorporated by reference in its entirety. One of the advantages of the IMS technique is that there is very little volume change between the molten solder and the resulting solder bump. The IMS technique utilizes a solder head that fills molds of various materials such as borosilicate glass, silicon, polymers, metals, and the like that are wide enough to cover most single chip modules. Excess solder is removed as the solder head moves about the mold. The IMS method for solder bonding is then carried out by applying a molten solder to a substrate in a transfer process. When smaller substrates, i.e., chip scale or single chip modules are encountered, the transfer step is readily accomplished since the solder-filled mold and substrate are relatively small in area and thus can be easily aligned and joined in a number of configurations. For instance, the process of split-optic alignment is frequently used in joining chips to substrates. The same process may also be used to join a chip-scale IMS mold to a substrate (chip) which will be bumped. One problem with current IMS systems is that they have been restricted to linear deposition of solder into rectangular molds. That is, the mold and the solder head are moved linearly with respect to each other such that the cavities move perpendicular to a slit in the solder head thereby filling the cavities as they pass. The molds are also limited to a rectangular configuration.

A subset technology of IMS is Controlled Collapse Chip Connection New Process ("C4NP"). C4NP allows the creation of pre-patterned solder balls to be completed while a silicon wafer is still in the front-end of a manufacturing facility, potentially reducing cycle time significantly. The solder bumps can be inspected in advance and deposited onto the silicon wafer in one simple. In this technology, a solder head with an injection aperture comprising molten solder scans over the surface of the mold. In order to fill the cavities on the mold, pressure is applied onto the reservoir of the C4NP head which comprises the molten solder as it is scanned over the cavities. One technical issue with C4NP is that when filling a cavity, the air trapped inside the cavity (or via) needs to be removed prior to the molten solder filling. Without proper venting of the cavities, partially filled cavities may result.

Therefore a need exists to overcome the problems with the prior art as discussed above.

SUMMARY OF THE INVENTION

Briefly, in accordance with the present invention, disclosed are a method and system for injection molding conductive bonding material into a plurality of cavities in a non-rectangular mold. The method comprises placing at least a non-rectangular mold and a fill head within a vacuum chamber. The non-rectangular mold includes a plurality of cavities. A vacuum is created within the vacuum chamber, thereby removing air within the chamber and in the plurality of cavities. The fill head is placed in substantial contact with the non-rectangular mold. Rotational motion is provided to at least one of the non-rectangular mold and the fill head while the fill head is in substantial contact with the non-rectangular mold. Conductive bonding material is forced out of the fill head toward the non-rectangular mold. The conductive bonding material is provided into at least one cavity of the plurality of cavities contemporaneous with the at least one cavity being in proximity to the fill head.

In another embodiment a system for injection molding conductive bonding material into a plurality of cavities in a non-rectangular mold is disclosed. The system includes a controller, a vacuum chamber, and at least one controllable vacuum pump. The controllable vacuum pump is mechanically coupled to the vacuum chamber for creating a vacuum in the vacuum chamber under control of the controller. A rotatable holder rotatably holds a non-rectangular mold. The non-rectangular mold includes a plurality of cavities. A fill head, within the vacuum chamber, deposits conductive bonding material on the non-rectangular mold. The controller is adapted for controlling a semiconductor manufacturing process as follows. With the non-rectangular mold in the vacuum chamber, the at least one controllable vacuum pump is controlled and a vacuum is created within the vacuum chamber. This removes gases from within the vacuum chamber and from the plurality of cavities.

The fill head is placed in substantial contact with the non-rectangular mold within the vacuum chamber. Rotational motion is provided to at least one of the non-rectangular mold and the fill head, relative to each other, while the fill head is in substantial contact with the non-rectangular mold. Conductive bonding material is forced out of the fill head toward the non-rectangular mold. With a vacuum created within the vacuum chamber, the conductive bonding material is provided into at least one cavity of the plurality of cavities contemporaneous with the at least one cavity being in proximity to the fill head.

An advantage of the foregoing embodiments of the present invention is that a global vacuum scheme is provided for conducting the IMS process. The present invention provides a vacuum chamber for removing air trapped within in cavities/vias of a mold. Molten solder is then injected with slight overpressure (with inert gas relative to the vacuum level) into a reservoir inside an IMS head maintaining molten solder. This provides an additional advantage of keeping the atmosphere free of oxygen. For molten solder that readily forms oxides, this absence of significant oxygen is a second major advantage. Another advantage is that the present invention can also be applied to rotational fill techniques discussed below.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Exemplary IMS System for Implementing Rotational Fill Techniques

Figure 1:
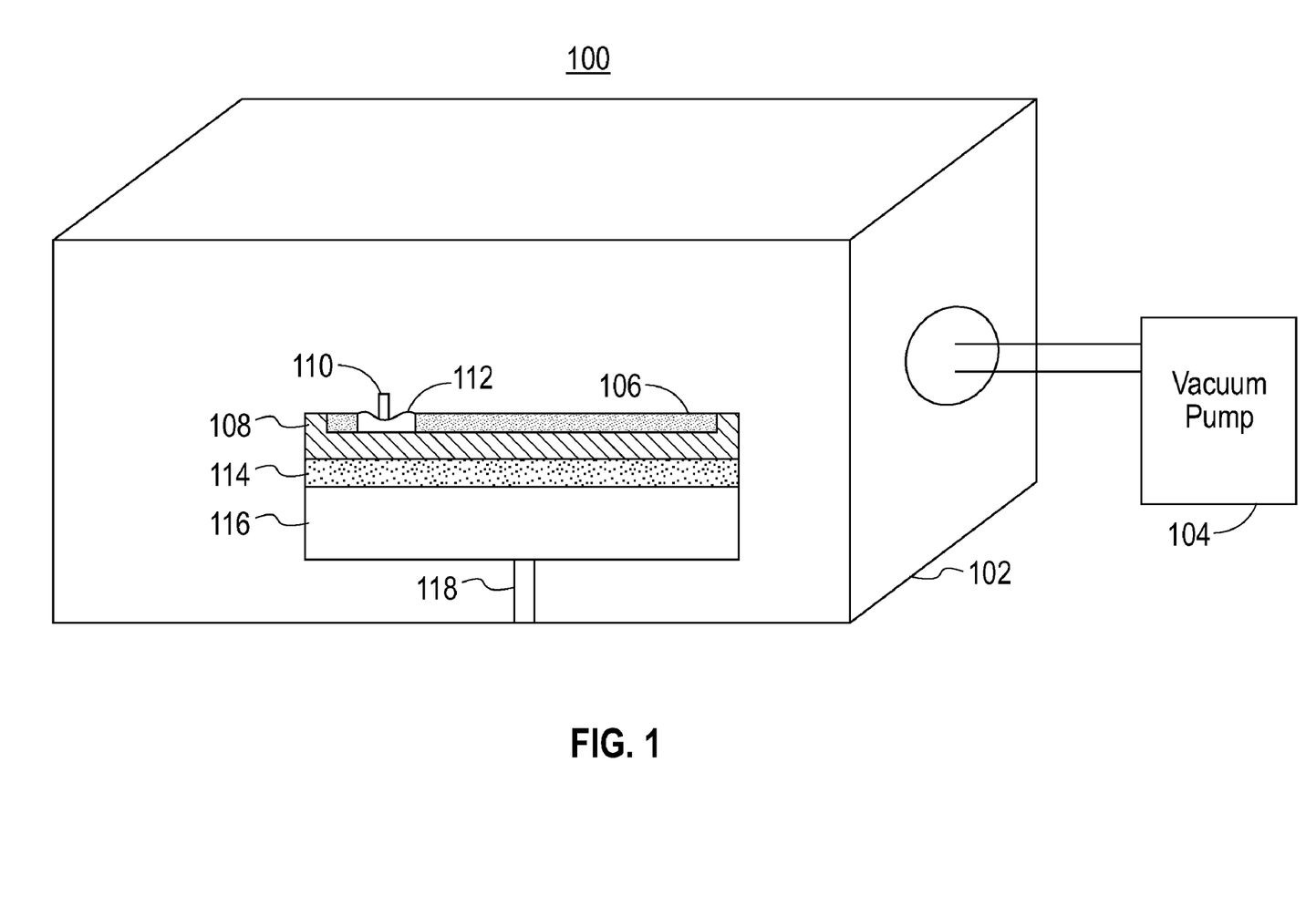
FIG. 1 is a block diagram showing a side perspective view of an IMS system within a vacuum chamber according to one embodiment of the present invention.
Figure 2:
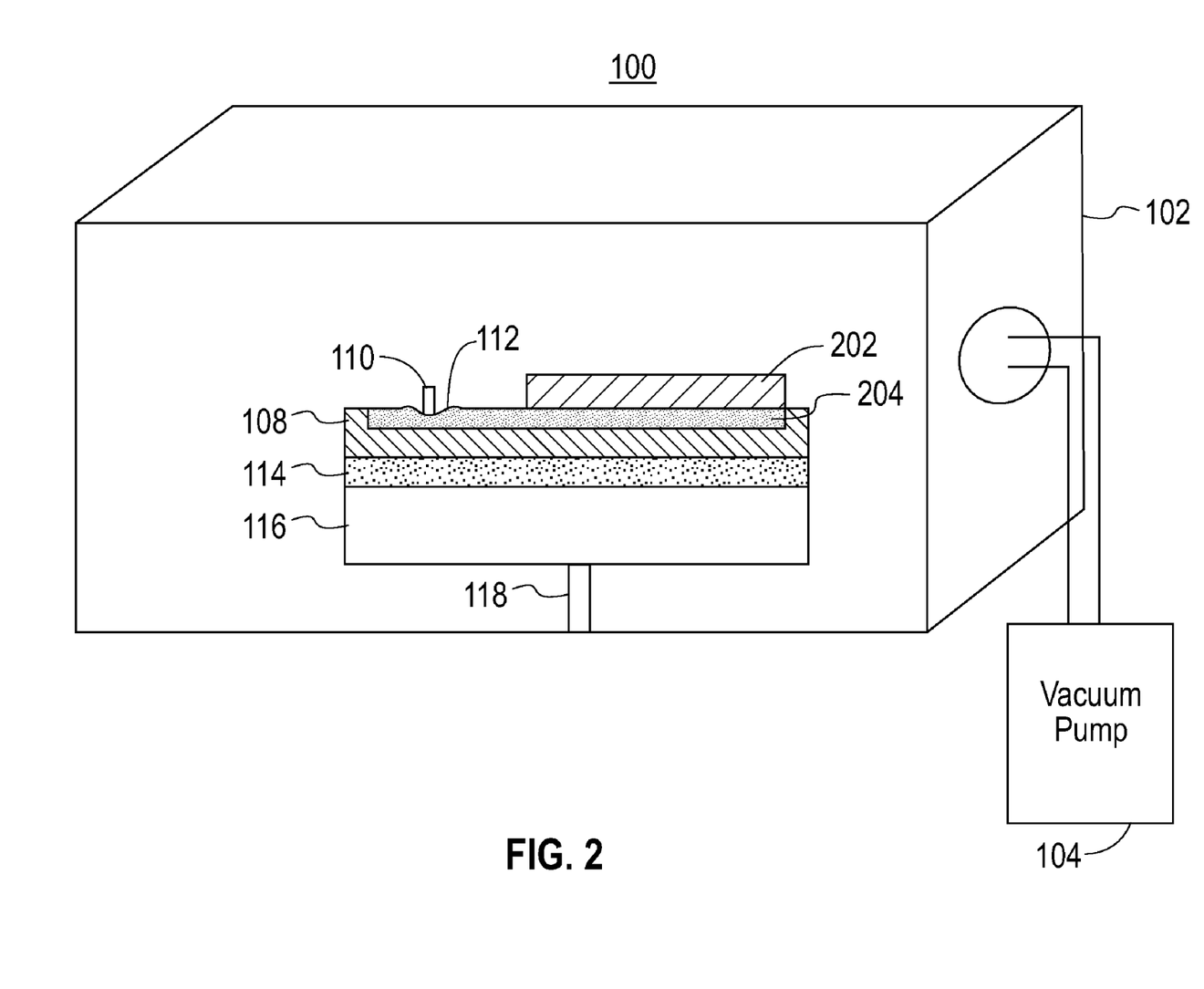
FIG. 2 is a block diagram showing a side perspective view of the IMS system within the vacuum chamber of FIG. 1 further including a fill head of a first type according to one embodiment of the present invention.

According to an embodiment of the present invention, FIG. 1 and FIG. 2 shows an exemplary IMS system 100 for depositing conductive bonding material on a non-rectangular mold. In one embodiment, the IMS system 100 is for depositing conductive bonding material on a substrate that is situated on a non-rectangular mold using rotational fill techniques.

Rotational fill techniques discussed in the co-pending and commonly owned U.S. patent application Ser. No. 11/409,232, entitled "Rotational Fill Techniques For Injection Molding Of Solder", which has been incorporated by reference in its entirety.

It should be noted that the present invention is not limited to non-rectangular molds. Rectangular molds and universal molds such as those discussed in the co-pending and commonly owned U.S. patent application Ser. No. 11/409,242, entitled "Universal Mold For Injection Molding Of Solder, which has been incorporated by reference in its entirety, are also applicable to the present invention. It should also be noted that the present invention is not limited to rotational fill techniques. For example, linear fill techniques and other conducting bonding material fill techniques such as those discussed in the co-pending and commonly owned U.S. patent application Ser. No. 11/409,244, entitled "Conductive Bonding Material Fill Techniques", which has been incorporated by reference in its entirety, are also applicable to the present invention.

FIG. 1 and FIG. 2 show the IMS system 100 as including a vacuum chamber 102 for performing the deposition of conducting bonding material on a circuit supporting substrate. In one embodiment, the vacuum chamber 102 is a "global" vacuum in that the entire IMS process, i.e., the deposition of conductive bonding material, is performed inside the vacuum chamber 102. One or more vacuum pumps 104 are coupled to the vacuum chamber to extract any air and/or gas within the chamber 102. It should be noted that the vacuum pump can be coupled to the vacuum chamber 102 at any location and can even reside within the vacuum chamber 102.

FIG. 1 also shows a non-rectangular mold 106 that is to receive conductive bonding material such as solder. Throughout this disclosure the term solder is used as an example of the type of material to be deposited into cavities or vias located on the non-rectangular mold 106. The non-rectangular mold 106, in one embodiment, is situated on top of a rotating holder 108 such as a moly chuck. The rotating holder is configured with an inner diameter that accommodates a standard silicon non-rectangular mold and is used as a circuit supporting substrate holder. The rotating holder 108 is also configured so that it can rotate about an axis. The rotating holder is able to rotate in either a clockwise direction or a counter-clockwise direction. As the rotating holder 108 rotates, solder is deposited by the fill head 202 through a slot 204 situated on a bottom side of the fill head 202. Rotational fill techniques are discussed in greater detail below. Also, the fill head 202 is discussed in greater detail in the co-pending commonly owned U.S. patent application Ser. No. 11/409,242, entitled "Universal Mold For Injection Molding Of Solder and U.S. patent application Ser. No. 11/409,233, entitled "Fill Head For Injection Molding Of Solder", both of which have been incorporated by reference in their entirety.

The non-rectangular mold 106, in one embodiment, is secured to the rotating holder 108 by a pin 110 that laterally fastens a notch 112 of the non-rectangular mold 106. It should be noted that even though the pin 110 is shown as extending above the non-rectangular mold 106, it can also reside flush or recessed within the non-rectangular mold 106. The pin 110 prevents the non-rectangular mold from moving in response to the rotation forces exerted by the rotating holder 108. In other words, the pin 110 maintains lateral stability of the non-rectangular mold 106. In one embodiment, the rotating holder 108 is situated on top of a heater 114. The heater 114 increases the temperature of the non-rectangular mold 106 so that solder does not solidify when being deposited by the IMS head 202. It should be noted that the heater 114 is optional. Also, the rotating holder 108 can be mounted on a slip ring 116 to allow rotation of the electrical connections 118 for the heater 116.

By performing the IMS procedure in a vacuum, all of the air in vias on the non-rectangular mold 106 receiving the conducing bonding material is removed. This process eliminates air trapped within the vias. Molten solder can then be injected with a slight overpressure with inert gas relative to the vacuum level into the reservoir of the molten solder inside the IMS head. This provides an additional advantage of keeping the atmosphere free of oxygen. For molten solder that readily forms oxides, this absence of significant oxygen is a second major advantage.

An Example of a Rotational Fill Technique

FIGS. 3-7 show a progressive sequence of an the IMS system 100 utilizing one example of a rotational fill technique. FIGS. 3-7 illustrate a top perspective view of the IMS system 100. The IMS system 100 includes the vacuum chamber 302 and a non-rectangular mold 304. As discussed above, the vacuum chamber 104 (shown in FIG. 1 and FIG. 1) removes the air inside the chamber 302, thereby preventing any air from being trapped inside cavities 306 residing on the non-rectangular mold 304. The non-rectangular mold 304, in one embodiment, is circular, however, other non-rectangular configurations may also be used according to the present invention. For example, the mold 304 may comprise oval, hexagonal, triangular, star, or any combination of these shapes. In one embodiment, the non-rectangular mold 304 corresponds to a silicon circular wafer. In one embodiment, the non-rectangular mold 304 is comprised of glass, silicon, metal, or the like. For example, borosilicate glass has the same coefficient of thermal expansion as a silicon circular wafer. In another embodiment a material such as molybdenum, which is biased, can be used for a mold to correct for mismatched coefficient of thermal expansion between the mold and a silicon wafer.

Figure 3:
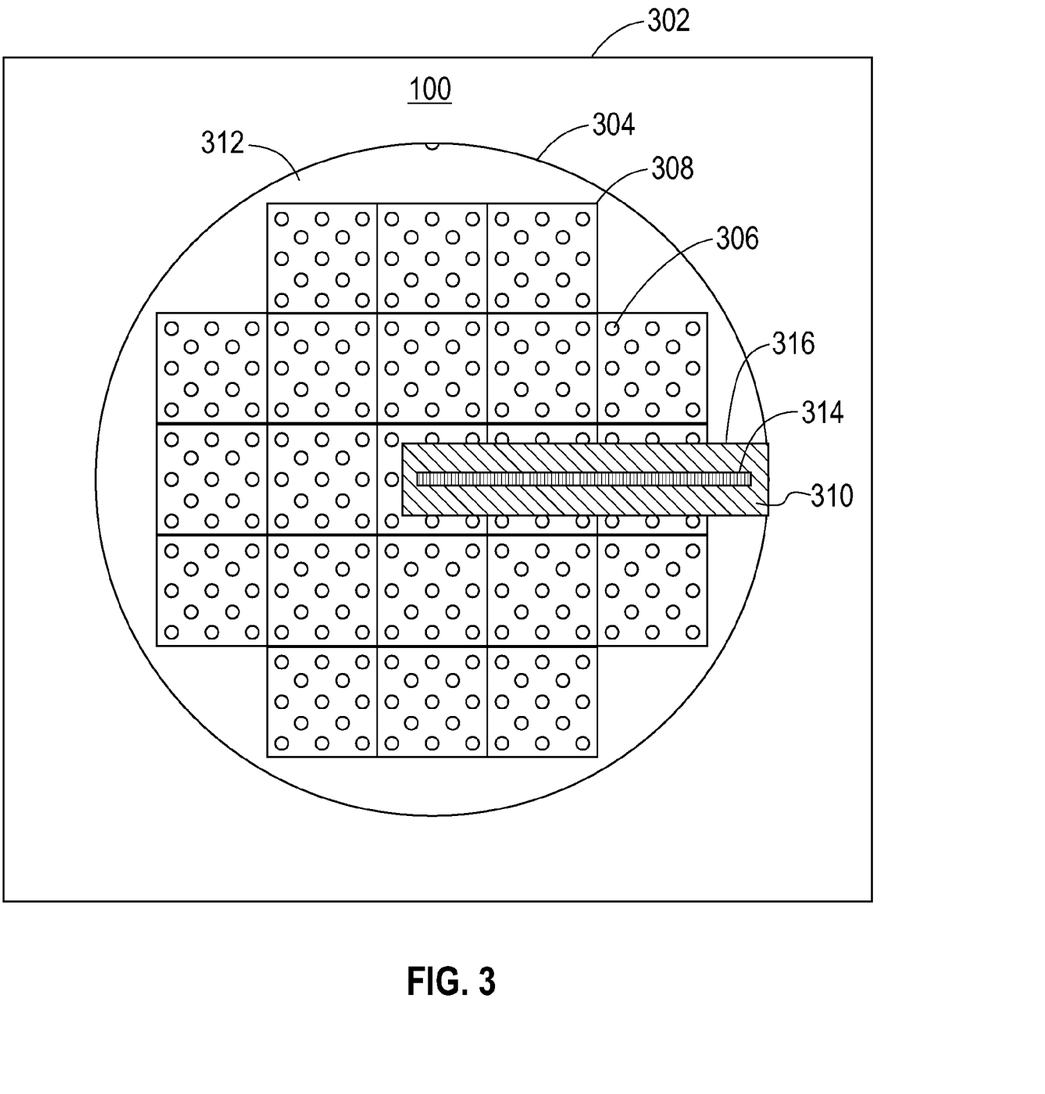
FIGS. 3-7 are top views of an IMS system illustrating a progressive sequence of filling cavities in a non-rectangular mold with conductive bonding material using a rotational fill technique that implements the fill head of the first type according to an embodiment of the present invention.
Figure 4:
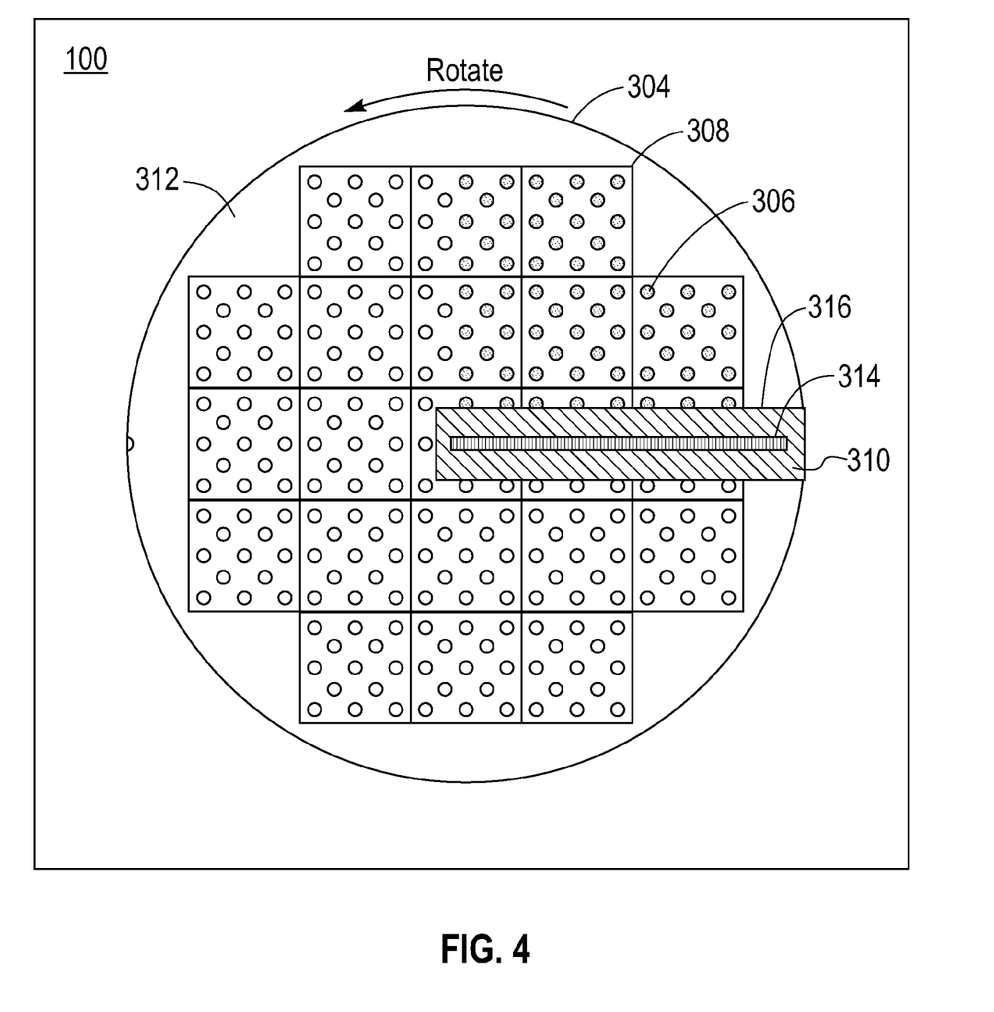
Figure 5:
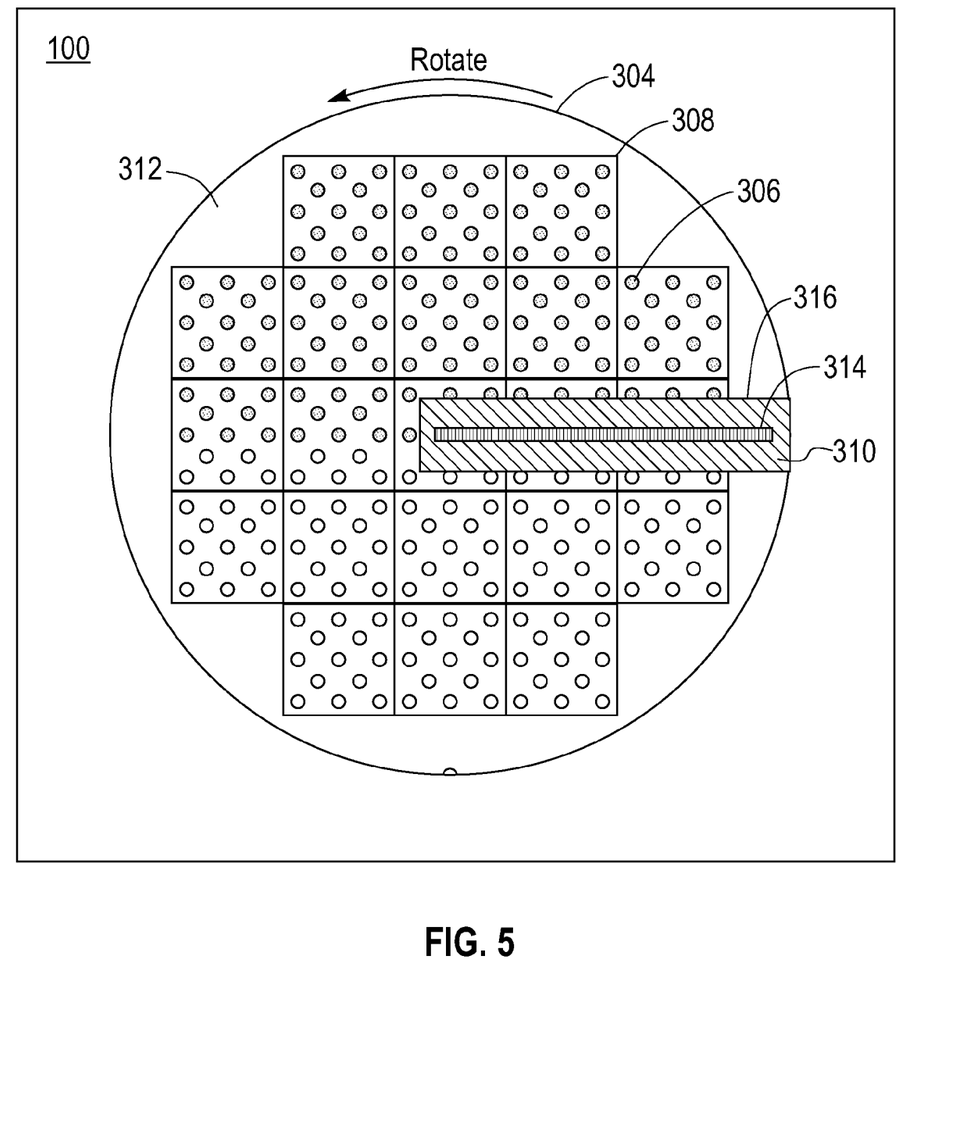
Figure 6:
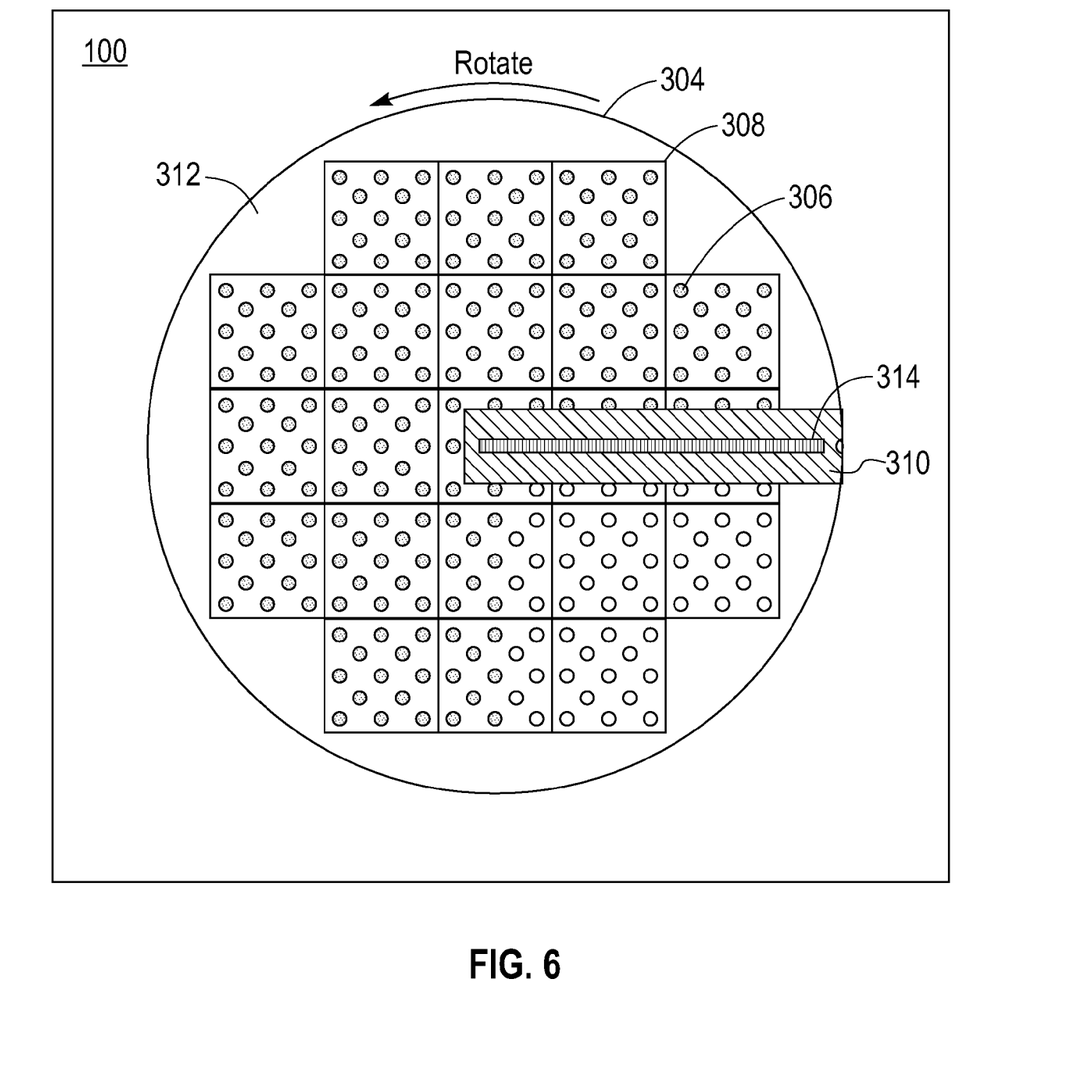
Figure 7:
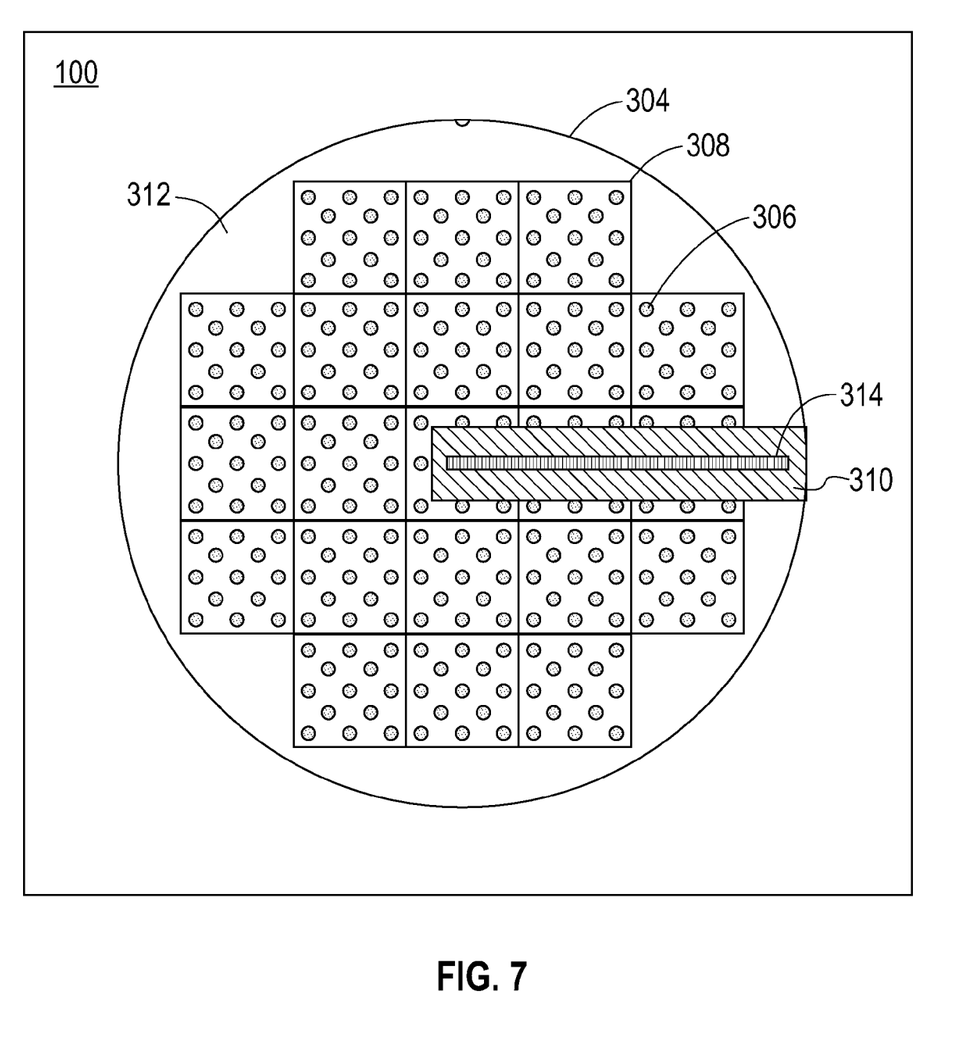

The non-rectangular mold 304 comprises a plurality of cavities 306 corresponding to wetting pads (not shown) on a silicon wafer (not shown). The square boundaries 308 represent chip boundaries and are for illustrative purposes only. In one embodiment, the cavities 306 are formed by applying polyimide to the borosilicate glass surface. The polyimide layer is then laser processed to produce cavities 306 in the polyimide layer only. In another embodiment, wet etching is used to form the cavities 306. However, the present invention is not limited to these two processes for forming cavities as should be well understood by those of ordinary skill in the art in view of the present discussion.

A fill head 310 is also included in the IMS system 100. The fill head 310, in one embodiment, is made from glass, metal, graphite, or the like. The fill head 310 is configured so that it scans smoothly over a surface 312 of the non-rectangular mold 304. An exemplary fill head 310 has a smooth coating (not shown) on the surface of the fill head 310 facing the mold 304 with a low friction coefficient to ensure smooth scanning over the non-rectangular mold 304. For example, the smooth surface can be an o-ring or any other surface that allows for smooth scanning. A reservoir (not shown) is coupled to the fill head 310 for retaining material to be provided to the cavities 306 via the fill head 310. For example, a conductive organic bonding material such as a conductive epoxy, a solder paste, molten solder, or an adhesive impregnated with conductors (e.g. metal particles), or the like is retained within the reservoir (not shown).

The fill head 310 also includes a delivery slot (or slit) 314 that allows solder material to flow from the reservoir (not shown) into the cavities 306. The fill head 310 in one embodiment also includes at least one heating member (not shown) having a temperature above the melting point of the solder. This causes the solder from the fill head 310 to fully liquefy (melt) and to flow into the cavities 306. The fill head 310 is discussed in greater detail below.

In one embodiment, an optional fill seal (not shown) is also coupled to the fill head 310. The optional fill seal (not shown) is situated on a portion of the fill head 310 that is in contact with the surface 312 of the mold 304. The optional fill seal (not shown) is situated so that the cavities 306 are filled prior to passing under the optional fill seal (not shown). The optional fill seal (not shown) prevents solder from leaking beyond the delivery slot (or slit) 314 as solder is provided to the cavities 306. When the optional fill seal (not shown) is situated against the surface 312 of the non-rectangular mold 304 a seal is created that allows gas and/or air within the cavities to escape. The optional fill seal (not shown) is comprised of either a flexible or rigid material. In another embodiment, a fill seal is not required. For example, in another embodiment, the fill head 310 itself acts as a fill seal. In this embodiment, a bottom surface of the fill head 310, which in one example is flat and smooth, is applied to the mold with enough pressure as to exhibit a squeegee effect across the mold 304.

FIGS. 3-7 show a fill head 310 situated along a radius of the non-rectangular mold 304. In one embodiment, the fill head 310 is slightly longer than the radius of the non-rectangular mold 304. FIGS. 4-7 show the IMS system 100 in 90 degree increments as either the fill head 310 is rotated about the center of the mold 304 or the non-rectangular mold 304 is rotated about its center, or both. It should be noted that rotational motion can be imparted to one or both of the non-rectangular mold 304 and the fill head 310. For example, the non-rectangular mold 304, in one embodiment, is rotated up to 360 degrees while the fill head 310 remains stationary. In another embodiment, the fill head 310 is rotated up to 360 degrees while the non-rectangular mold 304 remains stationary. In yet another embodiment, both the non-rectangular mold 304 and the fill head 310 are rotated relative to each other.

The rotational motion, in one embodiment, is continuous so that the non-rectangular mold 304 and/or the fill head 310 smoothly rotates without stopping. In another embodiment, the rotational force is applied in increments. Although the rotation is shown in a counter clockwise manner, the rotational motion can also be applied in a clockwise manner. Throughout this disclosure, an exemplary embodiment is discussed wherein the fill head 310 remains stationary while the non-rectangular mold 304 is rotated. Additionally, even though in this example a single non-rectangular mold 304 and a single fill head 310 are shown, it should be understood by those of ordinary skill in the art in view of the present discussion that multiple non-rectangular molds 304 and/or multiple fill heads 306 can be combined in a system according to the present invention. Additionally, it should be understood that the non-rectangular mold 304 can be situated above or below the fill head 310, according to the present invention.

As the non-rectangular mold 304 is rotated about its center, the cavities 306 pass under the delivery slot (or slit) 314. Back pressure is applied to the solder in the reservoir (not shown) by, for example, injecting a gas such as nitrogen or argon into the reservoir (not shown). The back pressure forces molten solder to flow from the reservoir (not shown) to the delivery slot (or slit) 314 whereby the molten solder exits to the surface 312 of the non-rectangular mold 304. The fill head 310 remains in substantial contact with the surface 312 of the non-rectangular mold 304 as the non-rectangular mold 304 rotates. In one embodiment, the molten solder is directly deposited to a substrate itself such as a circuit supporting substrate without using a mold 304. In this embodiment, the substrate is non-rectangular and has cavities similar to the cavities 306 on the mold 304. The same procedure as described above with respect to the mold 304 is applicable when directly depositing solder onto a non-rectangular substrate.

The filling seal (not shown), which is also in substantial contact with the surface 312, exhibits a squeegee effect and guides the molten solder into the cavities 306 of the non-rectangular mold 304. Filled cavities are represented by the darkened circles in FIGS. 4-7. The fill head 310, according to one embodiment, also includes at least one gas channel (not shown) comprising a gas with a temperature below the melting point of the solder. This causes the molten or liquefied solder to solidify in the cavity 306 as the cavity passes under a trailing edge 316 of the fill head 310. The fill head 310 is discussed in greater detail below.

One advantage of the present invention is the ability to fill non-rectangular molds with solder without air being trapped inside the cavities or vias. Current IMS systems operate in a linear manner. That is, the mold and fill head move in a linear direction with respect to each other. Non-rectangular molds such as circular molds are desirable for use with circular substrates, such as silicon wafers. The rotational fill techniques of the present invention allow non-rectangular molds such as circular molds to be filled without adapters. For example, prior art techniques place rectangular adapters on circular molds and scan a fill head in a linear direction across the mold. By applying these rotational fill techniques in a vacuum, cavities and vias on a non-rectangular mold can be filled with solder in a more consistent manner. This results in a more reliable production yield.

After the non-rectangular mold 304 has been rotated up to 360 degrees all of the cavities 306 are filled. The fill head 310 then can transition to an adjacent mold (not shown). In one embodiment, as the fill head 310 is transitioning from mold to mold, the back pressure is released thereby causing the solder to retract back from the delivery slot (or slit) 314. However, in some instances the fill head 310 or a portion of the fill head 310 extends beyond the non-rectangular mold 304 thereby exposing the delivery slot (or slit) 314 as it is transitioning. This can result in solder leaking out of the fill head either compromising the filled cavities and/or wasting the solder. To avoid this problem a parking space 818, in one embodiment, is coupled to the edges of the non-rectangular mold 304 where the fill head 310 transitions to the next non-rectangular mold 304.

Figure 8:
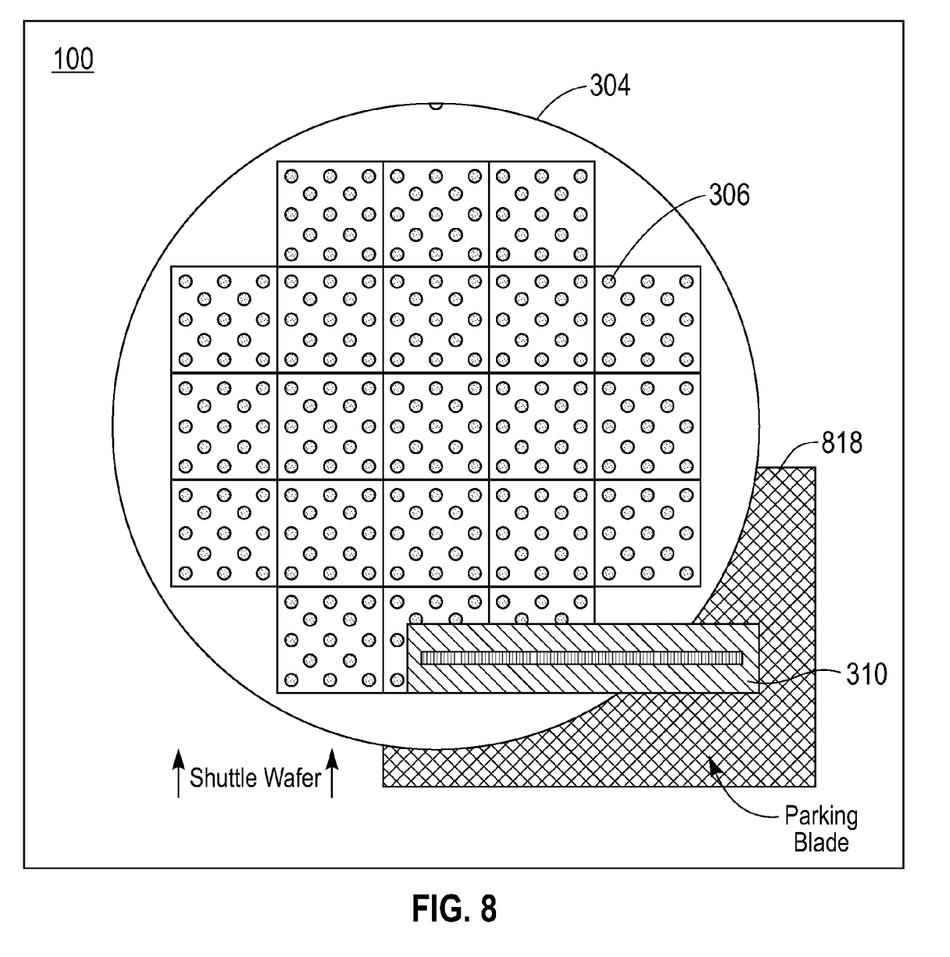
FIG. 8 is a top view of an IMS system illustrating the transitioning of a fill head from a non-rectangular mold after filling cavities in the mold with a conductive bonding material according to an embodiment of the present invention.

FIG. 8 illustrates the embodiment where a parking space 818 is coupled to the non-rectangular mold 304 and where the fill head 310 has partially transitioned to the parking space 818. Once the cavities 306 on the non-rectangular mold 304 have been filled with solder, the non-rectangular mold 304 is shuttled so that the fill head 310 transitions to the next mold (not shown). As the non-rectangular mold 304 is shuttled, a portion of the fill head 310 or the entire fill head 310 extends beyond the non-rectangular mold 304. The fill head 310 remains in substantial contact with the parking space 818 thereby preventing spillage of the solder.

Figure 9:
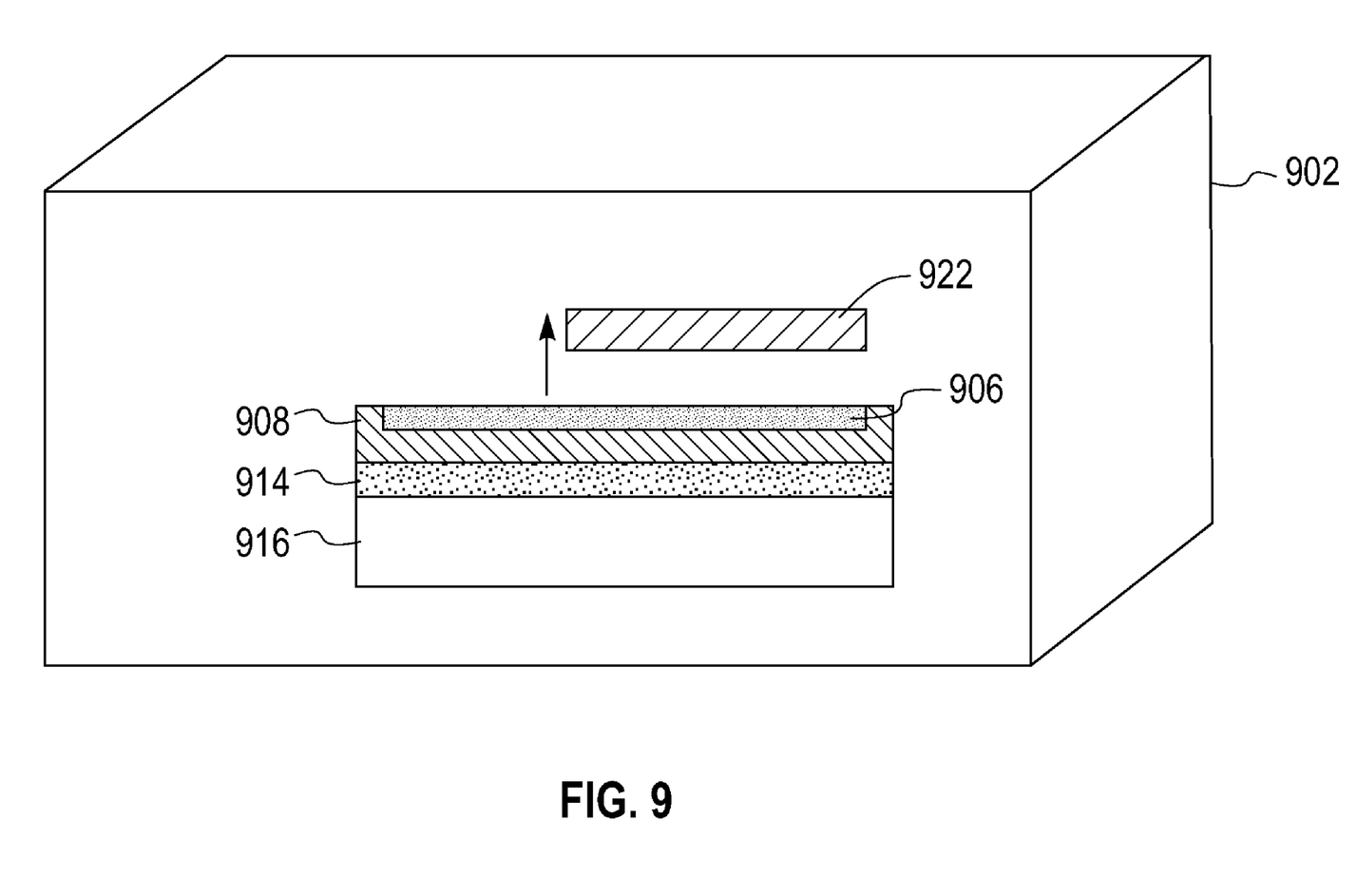
FIG. 9 is a block diagram showing a side perspective view of an IMS system within a vacuum chamber implementing another example of a fill head of a second type according to one embodiment of the present invention.

However, FIG. 9 shows one embodiment where the fill head can be lifted off of the mold 904 when transitioning to the next mold (not shown). FIG. 9 shows the vacuum chamber 902 including the mold 906 situated on the rotating holder 908. As discussed above, the rotating holder 908 is situated on top of a heater 914. A slip ring 916 is situated beneath the heater and rotating holder assemblies 914, 908. FIG. 9 also shows a fill head 922 that is configured to be lifted off of the mold 904 once the injection of solder is completed. The fill head 922 includes solder in a molten state and can be lifted without leaking the alloy, as disclosed in the co-pending and commonly owned U.S. patent application having Ser. No. 11/495,966, entitled "Pressure-Only Molten Metal Valving Apparatus and Method", the entire disclosure being incorporated by reference herein. Thus, it is possible to place the fill head 922 onto the mold 904 to be filled and once filled in a rotary fashion, the fill head 922 may be lifted. The fill head 922 is lifted while the stage continues to rotate, thus breaking the solder connection between the fill head 922 and the filled cavities/vias.

Exemplary Process of Filling a Non-Rectangular Mold with Solder

Figure 10:
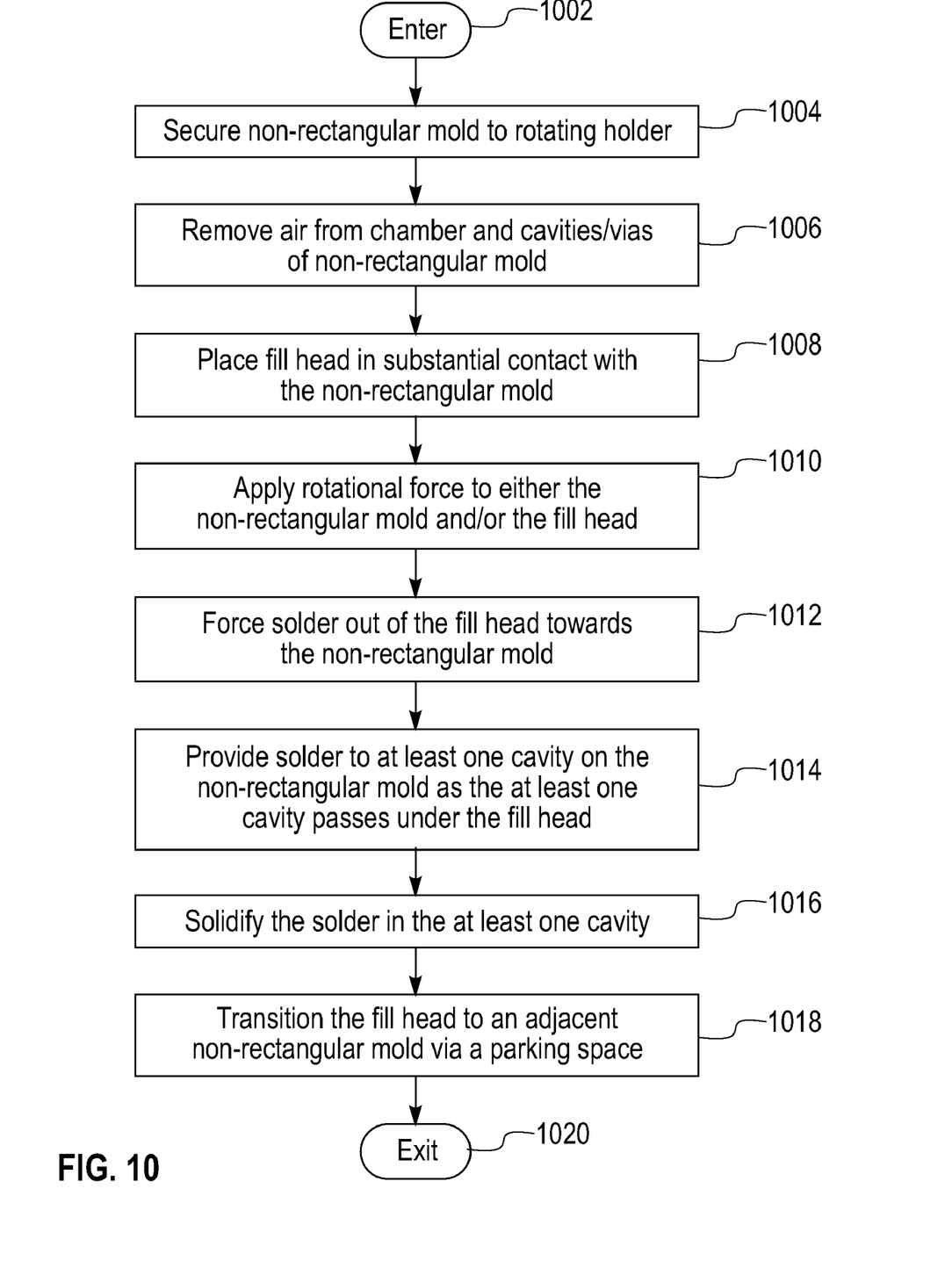
FIG. 10 is an operational flow diagram illustrating an exemplary process of filling non-rectangular molds using rotational fill techniques according to one embodiment of the present invention.

FIG. 10 is an operational flow diagram showing the exemplary process of filling cavities in a non-rectangular mold using rotational fill techniques. The operational flow diagram of FIG. 10, with additional reference to FIG. 1 and FIG. 3, begins at step 1002 and flows directly to step 1004. The non-rectangular mold 106, at step 1004, is secured to the rotating holder 108. For example, a pin 110 is inserted in a notch 112 within the non-rectangular mold 106, 304. Air within the vacuum chamber 102 and any cavities/vias 306, at step 1006, is removed. The fill head 310, at step 1008, is placed in substantial contact with the non-rectangular mold 304. A rotational force, at step 1010, is applied to either the non-rectangular mold 304 and/or the fill head 310. Solder, at step 1012, is forced out of the fill head 310 towards the non-rectangular mold 304. For example, a back pressure is applied to a reservoir (not shown) forcing the solder to flow through a channel (not shown) and out of the fill head 310. A heating member is included at the fill head 310 with a temperature above the melting point of the solder. This allows the solder to remain liquefied or molten as the solder contacts the mold surface 312.

Solder, at step 1014 is provided to at least one cavity 306 on the non-rectangular mold 304 as the at least one cavity 306 passes under the fill head 310. A filling seal (not shown) exhibits a squeegee effect and guides the molten solder down into the cavity. The solder in the at least one cavity 306, at step 1016, is solidified as the solder comes into contact with a cooling gas having a temperature below the melting point of the solder. The fill head 310, at step 1018, is transitioned onto an adjacent non-rectangular mold via a parking space. In some instances it may be necessary to use a parking space 818 (see FIG. 8) to assist in the transition to avoid spillage of the solder. The control flow then exits at step 1020.

NON-LIMITING EXAMPLES

The foregoing embodiments of the present invention are advantageous because they provide a technique for filling non-rectangular molds or substrates with a conductive bonding material using an IMS system. The present invention allows for molds that more closely resemble their associated non-rectangular silicon wafer to be used. Furthermore, the fill heads of the present invention provide a means for heating throughout the heads that melt material to be deposited into cavities of a mold and cooling gasses that solidify the material within the cavities.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method of injection molding solder into a plurality of cavities in a circular mold, the method comprising:
    placing at least a circular mold and a fill head within a vacuum chamber, wherein the circular mold includes a plurality of cavities, and wherein the fill head is slightly longer than a diameter of the circular mold, the fill head being configured to provide conductive bonding material to the plurality of cavities bi-directionally, and further wherein the fill head comprises a substantially curved configuration substantially matching a curvature of a perimeter of the circular mold, the fill head being aligned relative to a radius of the circular mold;
    creating a vacuum within the vacuum chamber, thereby removing air within the chamber and in the plurality of cavities;
    placing the fill head in substantial contact with the circular mold;
    providing rotational motion to the fill head while the fill head is in substantial contact with the circular mold, and wherein the rotational motion provides a relative rotation of substantially up to 180 degrees between the fill head and the circular mold to provide the solder into the plurality of cavities;
    forcing solder out of the fill head toward the circular mold;
    providing the solder into the plurality of cavities contemporaneous with the plurality of cavities being in proximity to the fill head;
    activating a heating member in the fill head, the heating member having a temperature above a melting point of the solder thereby maintaining the solder in a molten state as the solder and the heating member are in close proximity to one another;
    channeling a cooling gas about a trailing edge of the fill head, the cooling gas having a temperature below the melting point of the solder thereby substantially solidifying the solder within at least one cavity of the plurality of cavities as the at least one cavity passes under the trailing edge of the fill head with cooling gas;
    lifting the fill head off of the circular mold after the solder is provided into the plurality of cavities;
    receiving temperature feedback from at least one thermocouple situated within the fill head; and
    transitioning the fill head from the circular mold, the fill head passing over an adapter coupled to the circular mold, to an adjacent circular mold as the fill head transitions from the circular mold to the adjacent circular mold thereby preventing spillage of solder from the transitioning fill head.

* * * * *